US010580621B2

(12) United States Patent
Ikari et al.

(10) Patent No.: US 10,580,621 B2
(45) Date of Patent: Mar. 3, 2020

(54) ELECTRODE PLATE

(71) Applicant: THINKON NEW TECHNOLOGY JAPAN CORPORATION, Tokyo (JP)

(72) Inventors: Atsushi Ikari, Shunan (JP); Satoshi Fujii, Tokyo (JP)

(73) Assignee: THINKON NEW TECHNOLOGY JAPAN CORPORATION, Tokyo (JP)

(*) Notice: Subject to any disclaimer, the term of this patent is extended or adjusted under 35 U.S.C. 154(b) by 0 days.

(21) Appl. No.: 16/322,953

(22) PCT Filed: Jul. 28, 2017

(86) PCT No.: PCT/JP2017/027560
§ 371 (c)(1),
(2) Date: Feb. 3, 2019

(87) PCT Pub. No.: WO2018/025781
PCT Pub. Date: Feb. 8, 2018

(65) Prior Publication Data
US 2019/0172682 A1 Jun. 6, 2019

(30) Foreign Application Priority Data
Aug. 4, 2016 (JP) ................. 2016-153987

(51) Int. Cl.
H01J 37/32 (2006.01)
H01L 21/67 (2006.01)

(52) U.S. Cl.
CPC .... H01J 37/3255 (2013.01); H01J 37/32541 (2013.01); H01L 21/67069 (2013.01); H01J 2237/0213 (2013.01); H01J 2237/334 (2013.01)

(58) Field of Classification Search
None
See application file for complete search history.

(56) References Cited

U.S. PATENT DOCUMENTS

| 2005/0167050 | A1 | 8/2005 | Oikawa |
| 2008/0242085 | A1 | 10/2008 | Fischer et al. |
| 2011/0204123 | A1* | 8/2011 | Dong ............... B23K 1/008 228/203 |
| 2014/0224417 | A1* | 8/2014 | Shahbazi ............ H01M 8/0286 156/249 |
| 2019/0164728 | A1* | 5/2019 | Ikari ................. H01J 37/32642 |
| 2019/0172687 | A1* | 6/2019 | Ikari ................. H01J 37/32541 |

FOREIGN PATENT DOCUMENTS

| JP | 2001-101968 | 4/2001 |
| JP | 2002-190466 | 7/2002 |
| JP | 2005-217240 | 8/2005 |
| JP | 2008-031558 | 2/2008 |

(Continued)

OTHER PUBLICATIONS

International Search Report dated Oct. 3, 2017 in International Application No. PCT/JP2017/027560.

*Primary Examiner* — Ashok Patel
(74) *Attorney, Agent, or Firm* — Wentsler LLC

(57) ABSTRACT

An electrode plate includes: a plurality of plate-like electrode members; and a joining part joining the electrode members to each other in a thickness direction. The joining part has a heat resistance to withstand a temperature of at least 150° C., melts at 700° C. or below.

9 Claims, 2 Drawing Sheets

(56) References Cited

FOREIGN PATENT DOCUMENTS

| JP | 2009-231611 | 10/2009 |
|----|-------------|---------|
| JP | 2011-049567 | 3/2011  |
| JP | 2011-100882 | 5/2011  |
| JP | 2015-029132 | 2/2015  |
| JP | 2015-088663 | 5/2015  |

\* cited by examiner

ELECTRODE PLATE

TECHNICAL FIELD

The present invention relates to an electrode plate, and particularly to an electrode used in a dry etching apparatus.

BACKGROUND ART

A dry etching apparatus using plasma is used as an etching apparatus in manufacture of a semiconductor integrated device such as an LSI. In this apparatus, while a wafer to be etched is disposed on a cathode of a planar electrode and etching gas is introduced into the apparatus, a high-frequency voltage is applied between a counter electrode (anode) and the cathode by a high-frequency oscillator, to thereby generate plasma of the etching gas between the electrodes. Positive ions serving as activated gas in the plasma enter a surface of the wafer, and etching is performed.

In the dry etching apparatus, metal contamination occurs when a metal component is used, and hence a silicon component is used. Representative examples of the silicon component are a focus ring that has a doughnut shape surrounding the wafer to be etched (Patent Literature 1), and a disc-like upper electrode (Patent Literature 2), for example.

CITATION LIST

Patent Literature

Patent Literature 1: Japanese Patent Laid-Open No. 2002-190466
Patent Literature 2: Japanese Patent Laid-Open No. 2005-217240

SUMMARY OF INVENTION

Technical Problem

It is necessary to maintain a thickness of the upper electrode at around a certain thickness in order to perform stable etching treatment, but the thickness decreases through use. Therefore, the upper electrode is replaced in accordance with the decrease amount of the thickness, and the used upper electrode is discarded. As above, the upper electrode has a problem in that a used member is wasted every time the upper electrode is replaced.

An object of the present invention is to provide an electrode plate capable of reducing waste of members that occurs by replacement.

Solution to Problem

An electrode plate according to the present invention includes a plurality of plate-like electrode members, and a joining part joining the electrode members to each other in a thickness direction. The joining part has a heat resistance to withstand a temperature of at least 150° C., melts at 700° C. or below, and contains boron oxide.

An electrode plate according to the present invention includes a plurality of plate-like electrode members, and a joining part joining the electrode members to each other in a thickness direction. The joining part has a heat resistance to withstand a temperature of at least 150° C., melts at 700° C. or below, contains any of In, Sn, and Al, and is a eutectic alloy with silicon.

Advantageous Effects of Invention

According to the present invention, by reheating and melting the joining part, one electrode member of which thickness has decreased can be replaced and the other electrode member can be reused. Therefore, the waste of the members that occurs by replacement can be reduced.

EMBODIMENT

An embodiment of the present invention is described below in detail with reference to the drawings.

Figure 1:
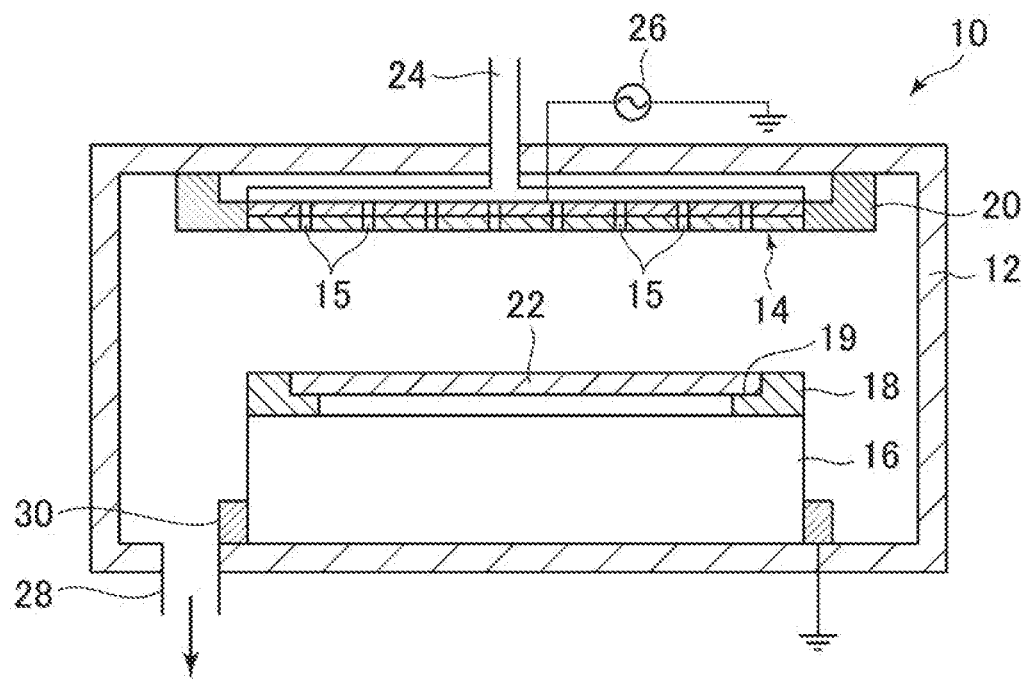
FIG. 1 is a cross-sectional view schematically illustrating a configuration of a dry etching apparatus including a focus ring fabricated from a ring for an electrode according to an embodiment.

A dry etching apparatus 10 illustrated in FIG. 1 includes a vacuum chamber 12, an electrode plate 14, a base 16, and a focus ring 18. The electrode plate 14 is a disc-like member, and is fixed to an upper part inside the vacuum chamber 12 by a support ring 20. The support ring 20 is made of silicon as an insulating member. The electrode plate 14 includes a plurality of through holes 15 each penetrating through the electrode plate 14 in a thickness direction. The electrode plate 14 is electrically connected with a high-frequency power supply 26. The electrode plate 14 is connected with a gas supply pipe 24. Etching gas supplied through the gas supply pipe 24 may flow into the vacuum chamber 12 from the through holes 15 of the electrode plate 14, and may be exhausted to outside from an exhaust port 28.

The base 16 is disposed at a lower part inside the vacuum chamber 12 and is surrounded by a ground ring 30. The ground ring 30 is made of silicon as an insulating member, and is grounded. The focus ring 18 is provided on the base 16. The focus ring 18 is made of silicon as an insulating member, and a concave part 19 supporting a peripheral edge of a wafer 22 is provided over an entire inner circumference.

The dry etching apparatus 10 is supplied with the etching gas through the electrode plate 14. When the high-frequency voltage is applied from the high-frequency power supply 26, plasma is generated between the electrode plate 14 and the wafer 22. The surface of the wafer 22 is etched by this plasma.

Figure 2:
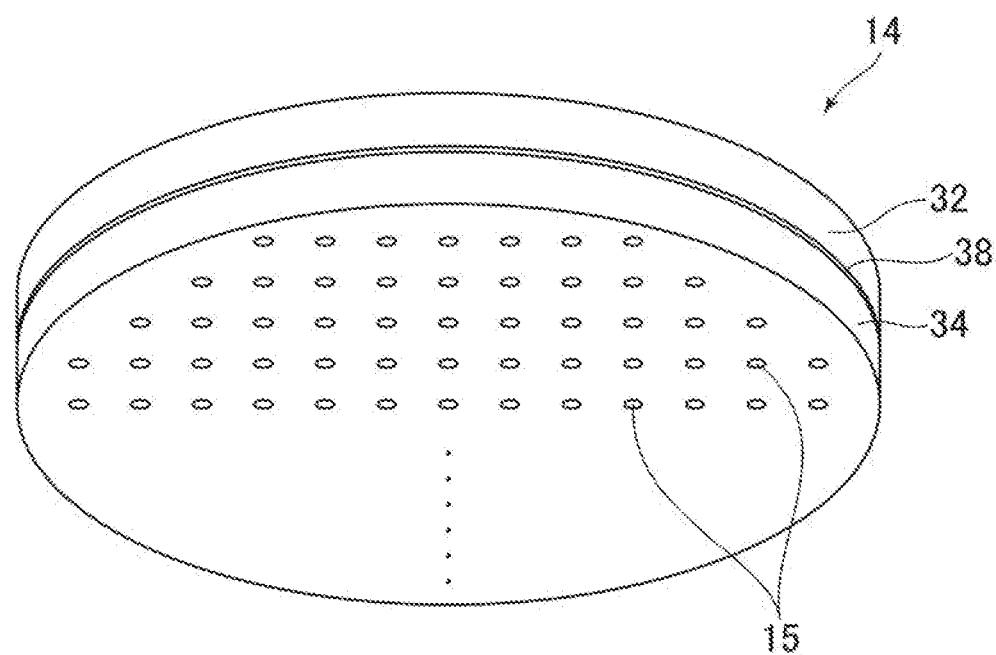
FIG. 2 is a perspective view illustrating an electrode plate according to the present embodiment.

As illustrated in FIG. 2, the electrode plate 14 includes a first electrode member 32 and a second electrode member 34 having a plate-like shape, and a joining part (not shown in FIG. 2) provided between the first electrode member 32 and the second electrode member 34. In the present embodiment, the first electrode member 32 and the second electrode member 34 are made of silicon. The first electrode member 32 and the second electrode member 34 may be monocrystalline silicon or polycrystalline silicon. A manufacturing method, purity, crystal orientation, etc. thereof are not limited. In case of FIG. 2, the first electrode member 32 and the second electrode member 34 are discs having the same thickness and diameter, and are coaxially superposed on joining surfaces 38. The electrode plate 14 has the plurality of through holes 15 each penetrating through the electrode plate 14 in a thickness direction.

Figure 3:
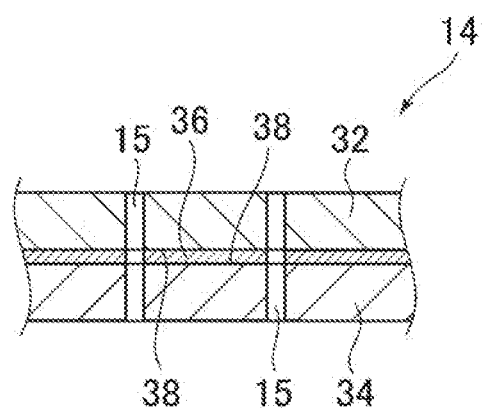
FIG. 3 is a partial cross-sectional view illustrating a joining part.

As illustrated in FIG. 3, the first electrode member 32 and the second electrode member 34 have the plurality of through holes 15 each penetrating through the first electrode member 32 and the second electrode member 34 in the thickness direction. The positions of the through holes 15 in the first electrode member 32 and the second electrode member 34 match each other. Therefore, the through holes 15 each penetrate through the electrode plate 14 from one side surface to another side surface thereof.

A joining part 36 is provided on at least a part between the first electrode member 32 and the second electrode member 34. In case of the figure, the joining part 36 is provided between the joining surfaces 38 of the first electrode member 32 and the second electrode member 34. The joining part 36 has a heat resistance to withstand a temperature of at least 150° C., and melts at 700° C. or below. The joining part 36 more preferably has a heat resistance to withstand a temperature of 300° C. In the present embodiment, the joining part 36 is a eutectic alloy of silicon and silicon containing metal forming the eutectic alloy with silicon. The metal forming a eutectic alloy with the silicon is any one of In, Sn, and Al (hereinafter also referred to as "alloying metal"). The purity of the alloying metal is not particularly limited as long as the alloying metal can form a eutectic with silicon, and the purity of the alloying metal is preferably 98% or more.

The sizes of the first electrode member 32 and the second electrode member 34 are not particularly limited, but the first electrode member 32 and the second electrode member 34 can have a thickness of 1 mm or more and 50 mm or less and a diameter of 300 mm or more and 460 mm or less, for example.

Next, a method of manufacturing the electrode plate 14 is described. First, surface treatment is performed on the first electrode member 32 and the second electrode member 34. More specifically, surfaces of the first electrode member 32 and the second electrode member 34 are treated by grinding, polishing, or the like, to preferably form mirror surfaces. The surfaces of the first electrode member 32 and the second electrode member 34 may be etched by mixed solution of hydrofluoric acid and nitric acid. As the mixed solution, chemical polishing solution (hydrofluoric acid (49%):nitric acid (70%):acetic acid (100%)=3:5:3) standardized as JIS H 0609 may be used.

Subsequently, an alloying metal foil is disposed on the surface of the second electrode member 34. A thickness of the alloying metal foil is preferably small in terms of reduction in energy for melting. The thickness of the alloying metal foil is preferably 0.1 μm to 100 μm, and more preferably 0.5 μm to 20 μm to exert joining strength. If the thickness of the alloying metal foil is lower than the above-described lower limit value, the alloying metal foil is easily damaged when disposed on the joining surfaces 38. If the thickness of the alloying metal foil is larger than the above-described upper limit value, a part where joining with silicon is insufficient is easily generated.

Subsequently, the first electrode member 32 is disposed on the alloying metal foil. The first electrode member 32 is disposed so as to be coaxial with the second electrode member 34 that has been already disposed. At this time, positioning is performed so that the positions of the through holes 15 match each other. As described above, the first electrode member 32 is superposed on the second electrode member 34 that has been already disposed via the alloying metal foil.

Next, heating is performed from the first electrode member 32 side, to thereby generate a melt containing silicon and the alloying metal. The heating method is not particularly limited, and the heating can be performed through resistance heating, optical heating, etc. The optical heating is preferable because positions to be heated can be easily shifted, and a heating amount can be easily changed based on the supplied power. For example, various kinds of lamps and lasers are used.

Figure 4:
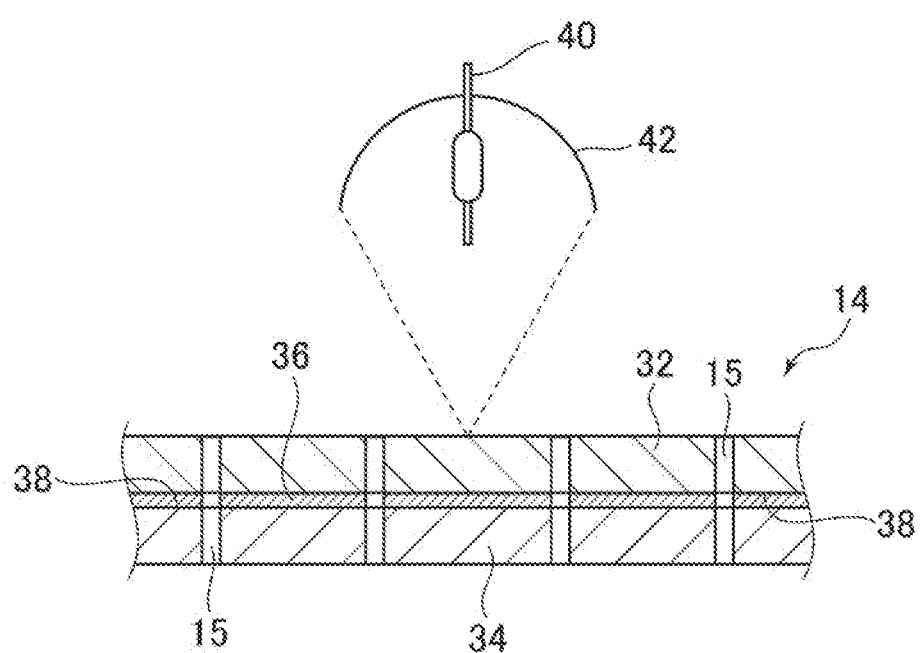
FIG. 4 is a cross-sectional view schematically illustrating an apparatus that manufactures the ring for the electrode.

In the present embodiment, an apparatus illustrated in FIG. 4 can be used. The apparatus illustrated in FIG. 4 includes at least one lamp 40 and at least one light condensing portion 42 that condenses light emitted from the lamp 40. As the lamp 40, a xenon lamp or a halogen lamp that is commonly used in an infrared crystal growth apparatus is usable. An output of the lamp is preferably about 1 kW to about 30 kW.

The heating is performed from upper side of the first electrode member 32. As long as the heating is performed from the upper side, the heating is not limited to be performed from the upper side in a direction perpendicular to the first electrode member 32, and the heating may be performed from obliquely upper side. The alloying metal foil is first melted by the heating and a metal melt is generated. Next, the joining surfaces 38 of the first electrode member 32 and the second electrode member 34 in contact with the metal melt are affected by the metal melt, and a melt containing silicon is generated. It is considered that, when the heating is stopped and temperature is lowered, the melt is solidified while forming an alloy phase containing a eutectic, and joining is completed. For example, in a case where an Al foil is used, the first electrode member 32 and the second electrode member 34 can be sufficiently joined by heating up to about 800° C.

A light focusing region normally has a diameter of about 10 mm to about 30 mm. The diameter of the light focusing region is increased to about 30 mm to about 100 mm by shifting a light emission position of the lamp from a focal point of an elliptical mirror. The light focusing region thus expanded makes it possible to expand a heated range. It is preferred that heating be performed by moving the light focusing region to scan the metal foil and the entire surfaces of the first electrode member 32 and the second electrode member 34.

Next, the melt containing silicon and the alloying metal is cooled and solidified to generate the joining part 36 containing a eutectic alloy. The first electrode member 32 and the second electrode member 34 can be joined to one another to manufacture the electrode plate 14 in the above-described manner.

When the alloying metal is Al and is cooled up to about 577° C., the joining part 36 containing Al-silicon eutectic (12.2 atomic % Al) is generated. A cooling speed depends on the alloying metal to be used. In the case where Al is used, the cooling speed is preferably controlled to 10° C. to 100° C./min. If the cooling speed is lower than the above-described lower limit value, a cooling time is lengthened and efficiency is low. If the cooling speed is higher than the above-described upper limit value, distortion tends to remain in the joining part 36.

The cooling speed can be controlled by gradually reducing the output of heating means after melting of the alloying metal foil is completed, and stopping the heating when the temperature of the joining part 36 is estimated to be lower than melting temperature of the eutectic. Such control of the heating temperature can be performed on the basis of a result of a measurement of relationship between power of the heating means and the temperature. The measurement is performed in advance, for example, while a thermocouple having a shape similar to the electrode members to be actually bonded is disposed between the electrode members.

Generation of the melt by the heating and generation of the joining part 36 containing the eutectic alloy by the cooling described above are preferably performed inside a chamber of argon atmosphere of 10 torr to 200 torr (about 1333 Pa to about 26664 Pa) in order to prevent oxidation of the alloying metal and silicon. It is also possible to prevent oxidation by decompression without using argon gas; however, this is not preferable because decompression causes evaporation of silicon and the inside of the chamber may be contaminated. Further, oxidation can be prevented by nitrogen gas; however, this is not preferable because silicon is nitrided at temperature of 1200° C. or more.

Treatment is preferred to be performed on sections in which the through holes 15 and the joining surfaces 38 intersect each other so that the eutectic alloy is not exposed. For example, the eutectic alloy can be prevented from being exposed on sections in which the through holes 15 and the joining surfaces 38 intersect each other by not disposing the alloying metal foil within 3 mm from each of the through holes 15.

The electrode plate 14 obtained as described above is disposed in the vacuum chamber 12 of the dry etching apparatus 10, and is subjected to etching treatment. The thickness of the electrode plate 14 decreases in accordance with frequency in use. When the electrode plate 14 is disposed in a state in which the second electrode member 34 is facing the wafer, the thickness decreases from a center of the second electrode member 34, and decreases in a curved manner toward the peripheral edge. When the decrease amount in the thickness of the second electrode member 34 exceeds a predetermined value, the electrode plate 14 is replaced.

The first electrode member 32 in the used electrode plate 14 that has been replaced can be reused by replacing the second electrode member 34 with a new product with respect to the first electrode member 32. In order to replace the second electrode member 34 with a new product with respect to the first electrode member 32, the electrode plate 14 is first heated to 600° C. or more, to thereby melt the joining part 36. Then, the second electrode member 34 is separated from the first electrode member 32. Next, the eutectic alloy is removed from the surface of the first electrode member 32 by grinding treatment. Then, the new electrode plate 14 can be obtained by joining the second electrode member 34 to the first electrode member 32 by the same procedure as the method of manufacturing the above mentioned electrode plate 14.

As described above, in the electrode plate 14, the second electrode member 34 of which thickness has decreased can be replaced by reheating and melting the joining part 36. Therefore, in the electrode plate 14, the first electrode member 32 can be reused, and hence the waste of the members that occurs by replacement can be reduced.

Modification

The present invention is not limited to the above-described embodiment, and can be modified, as appropriate, within the scope of the present invention.

In the above mentioned embodiment, the case where the first electrode member 32 and the second electrode member 34 have the same thickness and diameter has been described, but the present invention is not limited thereto, and the first electrode member 32 and the second electrode member 34 may have different thicknesses and diameters.

The case where the second electrode member 34 is made of silicon has been described, but the present invention is not limited thereto, and the second electrode member 34 may be made of a material such as SiC having a better plasma resistance than silicon.

The case where the first electrode member 32 and the second electrode member 34 have the through holes 15 has been described, but the present invention is not limited thereto, and the first electrode member 32 and the second electrode member 34 do not necessarily need to have the through holes 15. The through holes 15 may be formed after the first electrode member 32 and the second electrode member 34 are joined to each other.

When the second electrode member 34 is replaced with a new product with respect to the first electrode member 32 in the used electrode plate 14 that has been replaced, the second electrode member 34 does not necessarily need to have the through holes 15. When the second electrode member 34 does not have the through holes 15, the through holes 15 are formed in the second electrode member 34 in accordance with the through holes 15 in the first electrode member 32 after the second electrode member 34 is joined to the first electrode member 32.

The case where the electrode plate 14 includes two electrode members (the first electrode member 32 and the second electrode member 34) has been described, but the present invention is not limited thereto, and the electrode plate 14 may include three or more electrode members.

The electrode plate 14 may be partitioned into three or more parts in a surface direction. By partitioning the electrode plate 14 into three or more parts in a surface direction, the electrode plate 14 that is larger in size can be obtained with use of electrode members cut out from smaller silicon crystal ingots for wafer.

In the above-described embodiment, the case where the electrode members are joined to each other with use of the alloying metal foil has been described, but the present invention is not limited thereto. It is considered that the electrode members can be joined to each other with use of powder or particles of the alloying metal.

In the above mentioned embodiment, the case where the joining part 36 contains alloying metal has been described, but the present invention is not limited thereto, and the joining part 36 may contain boron oxide. A method of manufacturing the electrode plate in the case where the joining part 36 contains boron oxide is described below.

First, the second electrode member 34 on which surface treatment is performed as in the above mentioned embodiment is heated to first temperature (180° C. to 280° C.), and a starting material made of particulate boric acid ($B(OH)_3$) is supplied to at least a part of the joining surface 38 of the second electrode member 34. The second electrode member 34 can be heated by heating means using a common electric resistance heater. Since the temperature of the joining surface 38 is 180° C. to 280° C., dehydration reaction of boric acid occurs on the joining surface 38. Water is desorbed from boric acid in about 10 seconds to about 60 seconds, and metaboric acid ($HBO_2$) is accordingly generated. Metaboric acid is dissolved into the desorbed water to generate a liquid substance having excellent fluidity.

In a case where the temperature of the second electrode member 34 is excessively low, water cannot be desorbed from boric acid, and metaboric acid cannot be obtained. In contrast, in a case where the temperature of the second electrode member 34 is excessively high, water is quickly desorbed from boric acid. As a result, boric acid supplied to the joining surface 38 of the second electrode member 34 may be splattered or boric acid may be quickly solidified. When the first temperature is 180° C. to 280° C., it is possible to obtain metaboric acid in a more reliable manner. The first temperature is preferably 200° C. to 240° C.

As the starting material made of particulate boric acid, granular boric acid having a diameter of 0.1 mm to 2 mm sold on the open market can be used as it is. When the starting material made of boric acid having a diameter of 0.1 mm to 2 mm is supplied to the surface of the second electrode member 34 heated to the first temperature, it is possible to form a layer containing metaboric acid described later. Boric acid is preferably supplied little by little to a part of the surface of the electrode member.

The liquid substance that has been generated through desorption of water from boric acid is spread by a spatula to form the layer containing metaboric acid. As described above, boric acid as the starting material is supplied little by little to the joining surface 38 of the second electrode member 34, and the generated liquid substance is spread every time. As a result, it is possible to form the uniform layer containing metaboric acid on the joining surface 38. A cut wafer is used as the spatula, which makes it possible to avoid mixture of impurity into the layer containing metaboric acid.

A thickness of the layer containing metaboric acid is preferably 1 mm or less, and more preferably 0.1 mm to 0.5 mm. Generation of bubbles caused by dehydration reaction can be suppressed when heating is performed in a subsequent step as the thickness of the layer containing metaboric acid is smaller. The thickness of the layer containing metaboric acid can be adjusted by controlling an amount of boric acid to be supplied as the starting material.

The second electrode member 34 that has been provided with the layer containing metaboric acid on the joining surface 38 is heated to increase its temperature to second temperature (500° C. to 700° C.). As a result, water is further desorbed from metaboric acid, and a melt containing boron oxide ($B_2O_3$) is accordingly generated. In a case where the second temperature is excessively high, the first electrode member 32 and the second electrode member 34 may be cracked due to difference of thermal expansion coefficients between boron oxide and silicon when cooling is performed in a subsequent step. In the case where the second temperature is 500° C. to 700° C., it is possible to obtain the melt containing boron oxide in a more reliable manner. The second temperature is preferably 550° C. to 600° C.

The first electrode member 32 on which surface treatment is performed is press-bonded on the melt containing boron oxide generated on a joining region of the second electrode member 34. Pressure in press-bonding is not particularly limited, and can be set as appropriate.

When the melt of boron oxide is solidified, the first electrode member 32 and the second electrode member 34 are joined to each other by the boron oxide layer. The melt is solidified, for example, when left at room temperature. By generating the joining part 36 in the above-described manner, the electrode plate 14 can be manufactured.

In order to replace the second electrode member 34 with a new product with respect to the first electrode member 32, the second electrode member 34 is separated from the first electrode member 32 by first heating the electrode plate 14 to 500° C. or more and melting the joining part 36, or by immersing the electrode plate 14 in water for a long time and eluting the boron oxide. Next, the boron oxide layer is removed by wiping the surface of the first electrode member 32 with use of cloth containing water or ethanol. Then, the new electrode plate 14 can be obtained by joining the second electrode member 34 to the first electrode member 32 by the same procedure as above.

The layer containing metaboric acid may be formed not over the entire region of the joining surfaces 38 of the first electrode member 32 and the second electrode member 34 but in a frame shape along an outer edge of the joining surfaces 38. The width of the frame-shaped layer containing metaboric acid can be 5 mm to 10 mm. The alloying metal foil is disposed in a region inside the frame-shaped layer containing metaboric acid. Before the alloying metal foil is disposed in the inside region, the frame-shaped layer containing metaboric acid may be cooled and the surface thereof may be polished to reduce the thickness. The frame-shaped layer containing metaboric acid is formed on the joining surface 38 of the second electrode member 34, and the alloying metal foil is disposed. Thereafter, the first electrode member 32 is disposed, and heating up to eutectic temperature or more and 700° C. or less is performed. The alloying metal forms a eutectic with silicon by the heating, and hence the first electrode member 32 and the second electrode member 34 can be joined to each other in a firmer manner. The eutectic alloy formed at this time is surrounded by the frame-shaped boron oxide layer. Therefore, the metal is hardly dispersed to cause contamination. Also in this case, as in the above mentioned embodiment, the second electrode member 34 can be replaced with a new product with respect to the first electrode member 32.

REFERENCE SIGNS LIST

10 Dry etching apparatus
14 Electrode plate
15 Through hole
32 First electrode member
34 Second electrode member
36 Joining part
38 Joining surface

The invention claimed is:

1. An electrode plate, comprising:
a plurality of plate-like electrode members; and
a joining part joining the electrode members to each other in a thickness direction of each of the electrode members, wherein the joining part has a heat resistance to withstand a temperature of at least 150° C., melts at 700° C. or below, contains any of In, Sn, and Al, and is a eutectic alloy with silicon.

2. The electrode plate according to claim 1, further comprising a plurality of through holes each penetrating in the thickness direction.

3. The electrode plate according to claim 1, wherein one of the electrode members disposed on one surface contains a silicon material or a material having a better plasma resistance than the silicon material.

4. An electrode plate, comprising:
a plurality of plate-like electrode members; and
a joining part joining the electrode members to each other in a thickness direction of each of the electrode members, wherein the joining part has a heat resistance to withstand a temperature of at least 150° C., melts at 700° C. or below, and contains boron oxide, wherein the joining part contains any of In, Sn, and Al, and contains a eutectic alloy with silicon.

5. The electrode plate according to claim 4, wherein one of the electrode members disposed on one surface contains a silicon material or a material having a better plasma resistance than the silicon material.

6. The electrode plate according to claim 4, further comprising a plurality of through holes each penetrating in the thickness direction.

7. An electrode plate, comprising:
a plurality of plate-like electrode members; and
a joining part joining the electrode members to each other in a thickness direction of each of the electrode members, wherein the joining part consists essentially of boron oxide.

8. The electrode plate according to claim 7, wherein one of the electrode members disposed on one surface contains a silicon material or a material having a better plasma resistance than the silicon material.

9. The electrode plate according to claim 7, further comprising a plurality of through holes each penetrating in the thickness direction.

\* \* \* \* \*